(12) United States Patent
Delaney et al.

(10) Patent No.: US 12,332,380 B2
(45) Date of Patent: *Jun. 17, 2025

(54) CHIP PACKAGING IN LIGHT DETECTION AND RANGING (LIDAR) SENSOR SYSTEM

(71) Applicant: Aurora Operations, Inc., Pittsburgh, PA (US)

(72) Inventors: Colin Delaney, Bozeman, MT (US); James Ferrara, Oakland, CA (US); Stefan Heinemann, Bozeman, MT (US); Amir Hosseini, San Jose, CA (US); Pruthvi Jujjavarapu, Palo Alto, CA (US); Yongxuan Liang, Fremont, CA (US); Parth Panchal, Englewood, CO (US); Zhizhong Tang, Palo Alto, CA (US)

(73) Assignee: Aurora Operations, Inc., Pittsburgh, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/517,431

(22) Filed: Nov. 22, 2023

(65) Prior Publication Data

US 2024/0159874 A1 May 16, 2024

Related U.S. Application Data

(63) Continuation of application No. 18/056,171, filed on Nov. 16, 2022, now Pat. No. 11,860,308.

(51) Int. Cl.
*G01S 7/481* (2006.01)
*G01S 17/931* (2020.01)
*H05K 7/20* (2006.01)

(52) U.S. Cl.
CPC .......... *G01S 7/4814* (2013.01); *G01S 7/4816* (2013.01); *G01S 7/4817* (2013.01); *G01S 17/931* (2020.01); *H05K 7/20509* (2013.01)

(58) Field of Classification Search
None
See application file for complete search history.

(56) References Cited

U.S. PATENT DOCUMENTS

| | | | |
|---|---|---|---|
| 10,948,600 B1 * | 3/2021 | Barber | G05D 1/0088 |
| 2005/0100345 A1 * | 5/2005 | Welch | G02B 6/12004 398/183 |

(Continued)

FOREIGN PATENT DOCUMENTS

| | | | | |
|---|---|---|---|---|
| GB | 2060307 A | * | 4/1981 | G01S 17/936 |
| WO | WO-2020205450 A1 | * | 10/2020 | G01S 17/34 |

*Primary Examiner* — Yuqing Xiao
*Assistant Examiner* — Jempson Noel
(74) *Attorney, Agent, or Firm* — PATENT LAW WORKS LLP

(57) ABSTRACT

An integrated chip packaging for a LIDAR sensor mounted to a vehicle includes a laser assembly configured to output a beam, an optical amplifier array chip configured to amplify a beam, and a transceiver chip coupled to the laser assembly and the optical amplifier array chip. The transceiver chip may be configured to emit the beam with reference to a first surface of the transceiver chip through an optical window and receive a reflected beam from a target through the optical window. The integrated chip packaging for the LIDAR sensor defines the configuration of optical components for providing a path for the optical signal to travel in and out of the LIDAR sensor and dissipating the heat generated by the optical components for improved performance.

20 Claims, 8 Drawing Sheets

(56) References Cited

U.S. PATENT DOCUMENTS

| | | | |
|---|---|---|---|
| 2011/0052114 A1* | 3/2011 | Bernasconi | H01S 5/026 |
| | | | 438/31 |
| 2012/0326006 A1 | 12/2012 | Iwatsuki | |
| 2013/0162976 A1* | 6/2013 | Dakin | G01P 5/26 |
| | | | 356/28.5 |
| 2016/0223319 A1* | 8/2016 | Munro | G01S 17/89 |
| 2018/0210156 A1* | 7/2018 | Lin | G02B 6/4251 |
| 2019/0011559 A1* | 1/2019 | Desai | G02B 6/12004 |
| 2021/0141058 A1 | 5/2021 | Piggott | |
| 2022/0003842 A1* | 1/2022 | Wang | G01S 17/42 |
| 2022/0206127 A1* | 6/2022 | Li | G01S 7/4814 |

* cited by examiner

CHIP PACKAGING IN LIGHT DETECTION AND RANGING (LIDAR) SENSOR SYSTEM

CROSS REFERENCE TO RELATED APPLICATIONS

This application is a continuation of U.S. patent application Ser. No. 18/056,171, filed Nov. 16, 2022, and entitled "Chip Packaging in Light Detection and Ranging (LIDAR) Sensor System," which is incorporated herein by reference in their entirety.

TECHNICAL FIELD

The present disclosure pertains generally to integrated chip packaging for a light detection and ranging (LIDAR) sensor system, and more specifically to the configuration of optical and electronic components in the integrated chip packaging for LIDAR sensors in autonomous vehicle technology.

BACKGROUND

LIDAR sensor systems are used for a variety of applications, from altimetry, to imaging, to collision avoidance. The design and implementation of a LIDAR sensor system may use a photonic integrated circuit (PIC) or integrated optical circuit which is a chip that contains photonic components. There is a need for a chip-scale package solution to configure and integrate the photonic components for providing efficient optical signal pathways and effective dissipation of heat for LIDAR sensor systems.

SUMMARY

Implementations of the present disclosure relate to packaging one or more optical and electronic components for a light detection and ranging (LIDAR) sensor system, and more particularly to a system and a method of integrated chip packaging including a configuration of optical and electronic components in a LIDAR sensor system for a vehicle. In one example, the optical and electronic components may include optoelectronic components and integrated silicon photonic chips.

In some implementations of the present disclosure, a LIDAR sensor system for a vehicle includes an integrated chip packaging that further includes a laser assembly configured to output a beam, an optical amplifier array chip configured to amplify the beam, and a transceiver chip coupled to the laser assembly and the optical amplifier array chip. The transceiver chip is configured to emit the beam with reference to a first surface of the transceiver chip through an optical window and receive a reflected beam from a target through the optical window. The integrated chip packaging further includes a cold plate coupled to a first side of the integrated chip packaging, the cold plate having a reference temperature. The integrated chip packaging further includes a first heat transfer component coupled to the first surface of the transceiver chip, the first heat transfer component configured to maintain a temperature of the transceiver chip at or below the reference temperature. The integrated chip packaging further includes a second heat transfer component coupled to an exposed surface of the optical amplifier array chip, the second heat transfer component configured to maintain a temperature of the optical amplifier array chip at or below the reference temperature. The integrated chip packaging further includes a third heat transfer component coupled to a seed laser in the laser assembly, the third heat transfer component configured to maintain a temperature of the seed laser such that a wavelength of the beam emitted is within a threshold range. The integrated chip packaging further includes a transimpedance amplifier configured to convert a photocurrent into a voltage and the transceiver chip coupled to the transimpedance amplifier. The transceiver chip is further configured to process the reflected beam to generate a photocurrent and send the photocurrent to the transimpedance amplifier. The integrated chip packaging further includes a first electrical feedthrough coupling an input to the laser assembly and a second electrical feedthrough coupling the voltage out of the integrated chip packaging. For instance, the optical window is at a second side of the integrated chip packaging opposite to the first side. In another instance, the transceiver chip is coupled to the laser assembly through micro-optics assembly and the transceiver chip is further configured to receive the beam from the laser assembly. In a further instance, the transceiver chip is coupled to the optical amplifier array chip by hybrid integration on a second surface of the transceiver chip opposite to the first surface and the transceiver chip is further configured to process the beam received from the laser assembly. For instance, the beam is processed for amplification using the optical amplifier array chip prior to being emitted from the first surface of the transceiver chip. In another instance, the transceiver chip is further configured to laterally extend over the optical window by a threshold offset. In a further instance, the distance of the optical window from the first surface of the transceiver chip is in a range between 0.2 millimeters and 9 millimeters. In another instance, the threshold offset is in a range between 0.2 millimeters and 9 millimeters. For instance, the first heat transfer component, the second heat transfer component, and the third heat transfer component are one from a group of thermal interface material, thermoelectric cooler, and liquid cooling system. In another instance, a length and a width of the optical window is in a range between 4 millimeters and 30 millimeters.

In some implementations of the present disclosure, an autonomous vehicle control system may include a laser assembly configured to output a beam, an optical amplifier array configured to amplify the beam, a transceiver coupled to the laser assembly and configured to emit the beam with reference to a surface of the transceiver through an optical window and receive the reflected beam from a target through the optical window, and one or more processors configured to determine at least one of a range to the target or a velocity of the target using the reflected beam, and control operation of an autonomous vehicle responsive to the at least one of the range or the velocity.

In some implementations of the present disclosure, an autonomous vehicle may include at least one of a LIDAR sensor system, a steering system, a braking system, and a vehicle controller. The LIDAR sensor system may include a laser assembly configured to output a beam, an optical amplifier array configured to amplify the beam, and a transceiver coupled to the laser assembly and configured to emit the beam with reference to a surface of the transceiver through an optical window and receive the reflected beam from a target through the optical window. The vehicle controller may include one or more processors configured to determine at least one of a range to the target or a velocity of the target using the reflected beam and control operation of the at least one of the steering system and the braking system responsive to the at least one of the range or the velocity.

These and other implementations may each optionally include one or more of the following aspects. For instance, the aspects may include the optical window being at a second side of the integrated chip packaging opposite to the first side. For instance, the aspects may also include the transceiver chip being coupled to the laser seed assembly through micro-optics assembly and further configured to receive the beam from the laser seed assembly, the transceiver chip being coupled to the optical amplifier array chip by hybrid integration on a second surface of the transceiver chip opposite to the first surface and further configured to process the beam received from the laser seed assembly, and the beam being processed for amplification using the optical amplifier array chip prior to being emitted from the first surface of the transceiver chip. For instance, the aspects further include the transceiver chip being configured to laterally extend over the optical window by a threshold offset. For instance, the aspects further include the first heat transfer component being one from a group of thermal interface material, thermoelectric cooler, and liquid cooling system.

Those skilled in the art will appreciate that the summary is illustrative only and is not intended to be in any way limiting. Any of the features described herein may be used with any other features, and any subset of such features can be used in combination according to various embodiments. Other aspects, inventive features, and advantages of the devices and/or processes described herein, as defined solely by the claims, will become apparent in the detailed description set forth herein and taken in conjunction with the accompanying drawings. Moreover, the language used in the present disclosure has been principally selected for readability and instructional purposes, and not to limit the scope of the subject matter disclosed herein.

BRIEF DESCRIPTION OF THE DRAWINGS

Implementations are illustrated by way of example, and not by way of limitation, in the figures of the accompanying drawings in which like reference numerals refer to similar elements and in which.

Figure 1A:
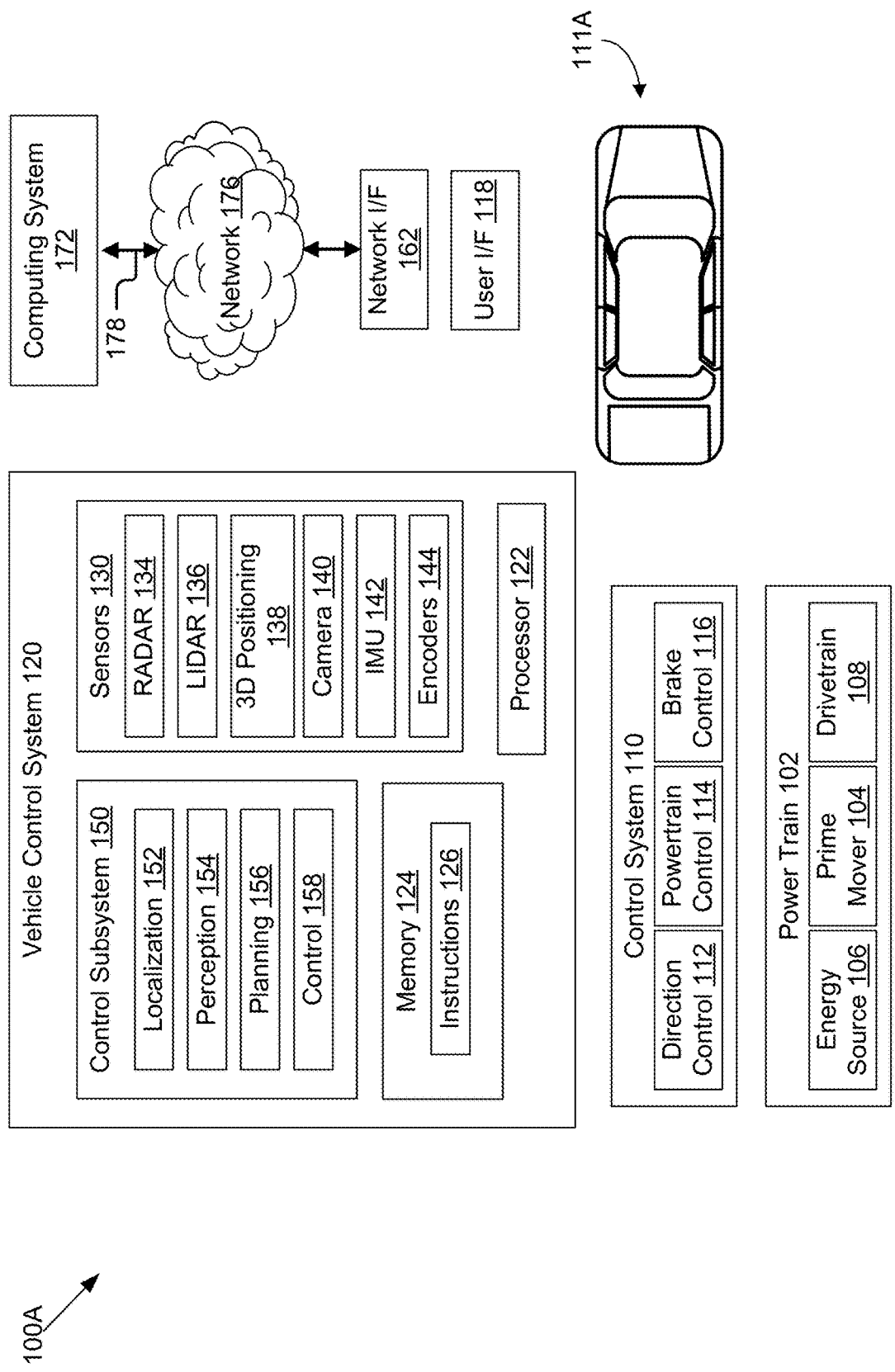
FIG. 1A is a block diagram illustrating an example of a system environment for an autonomous vehicle according to some implementations.

It should be understood that alternative implementations of the structures and methods illustrated herein may be employed without departing from the principles described herein.

DETAILED DESCRIPTION

According to certain aspects, an integrated chip packaging for a LIDAR sensor mounted to a vehicle may include a laser seed assembly configured to output a beam, an optical amplifier array chip configured to amplify a beam, and a transceiver chip coupled to the laser seed assembly and the optical amplifier array chip. The transceiver chip may be configured to emit the beam perpendicularly from a first surface of the transceiver chip through an optical window and receive a reflected beam from a target through the optical window. The integrated chip packaging for the LIDAR sensor defines the configuration of optical components for providing a path for the optical signal to travel in and out of the LIDAR sensor and dissipating the heat generated by the optical components for improved performance.

In the following description, for purposes of explanation, numerous specific details are set forth to provide a thorough understanding of the various aspects of different example implementations. Note that any particular example implementation may in various cases be practiced without all of the specific details and/or with variations, permutations, and combinations of the various features and elements described herein. Reference will now be made in detail to the implementations of the present disclosure, examples of which are illustrated in the accompanying drawings. Wherever possible, the same reference numbers are used in the drawings and the description to refer to the same or like parts.

Furthermore, relative terms, such as "lower" or "bottom" or "back" or "below" and "upper" or "top" or "front" or "above" may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The example term "lower" can, therefore, encompass both an orientation of "lower" and "upper," depending upon the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Referring to the drawings, wherein like numbers denote like parts throughout the several views, FIG. 1A illustrates an example of a system environment 100A for an autonomous vehicle 111A within which various techniques disclosed herein may be implemented. The vehicle 111A, for example, may include a powertrain 102 including a prime mover 104 powered by an energy source 106 and capable of providing power to a drivetrain 108, as well as a control system 110 including a direction control 112, a powertrain control 114, and a brake control 116. The vehicle 111A may be implemented as any number of different types of vehicles, including vehicles capable of transporting people and/or cargo, and capable of traveling by land and it should be appreciated that the aforementioned components 102-116 may vary widely based upon the type of vehicle within which these components are utilized.

For simplicity, the implementations discussed hereinafter focus on a wheeled land vehicle such as a car, van, truck, bus, etc. In such implementations, the prime mover 104 may include one or more electric motors and/or an internal combustion engine (among others). The energy source 106 may include, for example, a fuel system (e.g., providing gasoline, diesel, hydrogen, etc.), a battery system, solar panels or other renewable energy source, and/or a fuel cell system. The drivetrain 108 includes wheels and/or tires along with a transmission and/or any other mechanical drive components suitable for converting the output of the prime mover 104 into vehicular motion, as well as one or more brakes configured to controllably stop or slow the vehicle 111A and direction or steering components suitable for controlling the trajectory of the vehicle 111A (e.g., a rack and pinion steering linkage enabling one or more wheels of the vehicle 111A to pivot about a generally vertical axis to vary an angle of the rotational planes of the wheels relative to the longitudinal axis of the vehicle). In some implementations, combinations of powertrains and energy sources may be used (e.g., in the case of electric/gas hybrid vehicles), and in other implementations, multiple electric motors (e.g., dedicated to individual wheels or axles) may be used as a prime mover 104. In the case of a hydrogen fuel cell implementation, the prime mover 104 may include one or more electric motors and the energy source 106 may include a fuel cell system powered by hydrogen fuel.

The direction control 112 may include one or more actuators and/or sensors for controlling and receiving feedback from the direction or steering components to enable the vehicle 111A to follow a desired trajectory. The powertrain control 114 may be configured to control the output of the powertrain 102, e.g., to control the output power of the prime mover 104, to control a gear of a transmission in the drivetrain 108, etc., thereby controlling a speed and/or direction of the vehicle 111A. The brake control 116 may be configured to control one or more brakes that slow or stop vehicle 111A, e.g., disk or drum brakes coupled to the wheels of the vehicle.

Other vehicle types, including, but not limited to, all-terrain or tracked vehicles, and construction equipment, may utilize different powertrains, drivetrains, energy sources, direction controls, powertrain controls and brake controls. Moreover, in some implementations, some of the components can be combined, e.g., where directional control of a vehicle is primarily handled by varying an output of one or more prime movers. Therefore, implementations disclosed herein are not limited to the particular application of the herein-described techniques in an autonomous wheeled land vehicle.

In the illustrated implementation, various levels of autonomous control including full or semi-autonomous control over the vehicle 111A can be implemented in a vehicle control system 120, which may include one or more processors 122 and one or more memories 124, with each processor 122 configured to execute program code instructions 126 stored in a memory 124. The processor(s) can include, for example, graphics processing unit(s) ("GPU(s)") and/or central processing unit(s) ("CPU(s)").

Sensors 130 may include various sensors suitable for collecting information from a vehicle's surrounding environment for use in controlling the operation of the vehicle 111A. For example, sensors 130 can include one or more detection and ranging sensors (e.g., a RADAR sensor 134, a LIDAR sensor 136, or both), a 3D positioning sensor 138, e.g., a satellite navigation system such as GPS (Global Positioning System), GLONASS (Globalnaya Navigazionnaya Sputnikovaya Sistema, or Global Navigation Satellite System), BeiDou Navigation Satellite System (BDS), Galileo, Compass, etc. The 3D positioning sensors 138 can be used to determine the location of the vehicle on the Earth using satellite signals. The sensors 130 can optionally include a camera 140 and/or an IMU (inertial measurement unit) 142. The camera 140 can be a monographic or stereographic camera and can record still and/or video images. The IMU 142 can include multiple gyroscopes and accelerometers capable of detecting linear and rotational motion of the vehicle 111A in three directions. One or more encoders 144, such as wheel encoders may be used to monitor the rotation of one or more wheels of vehicle 111A. In some implementations, the LIDAR sensor 136 may include a structure of the silicon photonics device for the coherent LIDAR system as described in detail below.

The outputs of sensors 130 may be provided to a set of control subsystems 150, including a localization subsystem 152, a perception subsystem 154, a planning subsystem 156, and a control subsystem 158. The localization subsystem 152 is principally responsible for precisely determining the location and orientation (also sometimes referred to as "pose" or "pose estimation") of the vehicle 111A within its surrounding environment, and generally within some frame of reference. The perception subsystem 154 is principally responsible for detecting, tracking, and/or identifying objects within the environment surrounding the vehicle 111A. A machine learning model in accordance with some implementations can be utilized in tracking objects. The planning subsystem 156 is principally responsible for planning a trajectory or a path of motion for vehicle 111A over some timeframe given a desired destination as well as the static and moving objects within the environment. A machine learning model in accordance with some implementations can be utilized in planning a vehicle trajectory. The control subsystem 158 is principally responsible for generating suitable control signals for controlling the various controls in the vehicle control system 120 in order to implement the planned trajectory of the vehicle 111A. Similarly, a machine learning model can be utilized to generate one or more signals to control the autonomous vehicle 111A to implement the planned trajectory.

It will be appreciated that the collection of components illustrated in FIG. 1A for the vehicle control system 120 is merely one example. Individual sensors may be omitted in some implementations. Additionally, or alternatively, in some implementations, multiple sensors of the same types illustrated in FIG. 1A may be used for redundancy and/or to cover different regions around a vehicle. Moreover, there may be additional sensors of other types beyond those described above to provide actual sensor data related to the operation and environment of the wheeled land vehicle. Likewise, different types and/or combinations of control subsystems may be used in other implementations. Further, while subsystems 152-158 are illustrated as being separate from processor 122 and memory 124, it should be appreciated that in some implementations, some or all of the functionality of a subsystem 152-158 may be implemented with program code instructions 126 resident in one or more memories 124 and executed by one or more processors 122, and that these subsystems 152-158 may in some instances be implemented using the same processor(s) and/or memory. Subsystems may be implemented at least in part using various dedicated circuit logic, various processors, various field programmable gate arrays ("FPGA"), various application-specific integrated circuits ("ASIC"), various real time controllers, and the like, as noted above, multiple subsystems may utilize circuitry, processors, sensors, and/or other components. Further, the various components in the vehicle control system 120 may be networked in various manners.

In some implementations, the vehicle 111A may also include a secondary vehicle control system (not illustrated), which may be used as a redundant or backup control system for the vehicle 111A. In some implementations, the secondary vehicle control system may be capable of fully operating the autonomous vehicle 111A in the event of an adverse event in the vehicle control system 120, while in other implementations, the secondary vehicle control system may only have limited functionality, e.g., to perform a controlled stop of the vehicle 111A in response to an adverse event detected in the primary vehicle control system 120. In still other implementations, the secondary vehicle control system may be omitted.

In general, different architectures, including various combinations of software, hardware, circuit logic, sensors, networks, etc. may be used to implement the various components illustrated in FIG. 1A. Each processor may be implemented, for example, as a microprocessor and each memory may represent the random-access memory ("RAM") devices comprising a main storage, as well as any supplemental levels of memory, e.g., cache memories, non-volatile or backup memories (e.g., programmable or flash memories), read-only memories, etc. In addition, each memory may be considered to include memory storage physically located elsewhere in the vehicle 111A, e.g., any cache memory in a processor, as well as any storage capacity used as a virtual memory, e.g., as stored on a mass storage device or another computer controller. One or more processors 122 illustrated in FIG. 1A, or entirely separate processors, may be used to implement additional functionality in the vehicle 111A outside of the purposes of autonomous control, e.g., to control entertainment systems, to operate doors, lights, convenience features, etc.

In addition, for additional storage, the vehicle 111A may include one or more mass storage devices, e.g., a removable disk drive, a hard disk drive, a direct access storage device ("DASD"), an optical drive (e.g., a CD drive, a DVD drive, etc.), a solid-state storage drive ("SSD"), network attached storage, a storage area network, and/or a tape drive, among others.

Furthermore, the vehicle 100 may include a user interface 118 to enable vehicle 111A to receive a number of inputs from and generate outputs for a user or operator, e.g., one or more displays, touchscreens, voice and/or gesture interfaces, buttons and other tactile controls, etc. Otherwise, user input may be received via another computer or electronic device, e.g., via an app on a mobile device or via a web interface.

Moreover, the vehicle 111A may include one or more network interfaces, e.g., network interface 162, suitable for communicating with one or more networks 176 to permit the communication of information with other computers and electronic devices, including, for example, a central service, such as a cloud service, from which the vehicle 111A receives information including trained machine learning models and other data for use in autonomous control thereof. The one or more networks 176, for example, may be a communication network and include a wide area network ("WAN") such as the Internet, one or more local area networks ("LANs") such as Wi-Fi LANs, mesh networks, etc., and one or more bus subsystems. The one or more networks 176 may optionally utilize one or more standard communication technologies, protocols, and/or inter-process communication techniques. In some implementations, data collected by the one or more sensors 130 can be uploaded to a computing system 172 via the network 176 for additional processing. In the illustrated implementation, the vehicle 111A may communicate via the network 176 and signal line 178 with a computing system 172. In some implementations, the computing system 172 is a cloud-based computing device. Additionally processing of autonomous vehicle data by computing system 172 in accordance with many implementations is described with respect to FIG. 2.

Each processor illustrated in FIG. 1A, as well as various additional controllers and subsystems disclosed herein, generally operates under the control of an operating system and executes or otherwise relies upon various computer software applications, components, programs, objects, modules, data structures, etc., as described in greater detail below. Moreover, various applications, components, programs, objects, modules, etc. may also execute on one or more processors in another computer (e.g., computing system 172) coupled to vehicle 100 via network 176, e.g., in a distributed, cloud-based, or client-server computing environment, whereby the processing required to implement the functions of a computer program may be allocated to multiple computers and/or services over a network.

In general, the routines executed to implement the various implementations described herein, whether implemented as part of an operating system or a specific application, component, program, object, module or sequence of instructions, or even a subset thereof, are referred to herein as "program code." Program code typically comprises one or more instructions that are resident at various times in various memory and storage devices, and that, when read and executed by one or more processors, perform the steps necessary to execute steps or elements embodying the various aspects of the present disclosure. Moreover, while implementations have and hereinafter are described in the context of fully functioning computers and systems, it should be appreciated that the various implementations described herein are capable of being distributed as a program product in a variety of forms, and that implementations can be implemented regardless of the particular type of computer readable media used to actually carry out the distribution.

Examples of computer readable media include tangible, non-transitory media such as volatile and non-volatile memory devices, floppy and other removable disks, solid state drives, hard disk drives, magnetic tape, and optical disks (e.g., CD-ROMs, DVDs, etc.) among others.

In addition, various program code described hereinafter may be identified based upon the application within which it is implemented in a specific implementation. However, it should be appreciated that any particular program nomenclature that follows is used merely for convenience, and thus the present disclosure should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the present disclosure is not limited to the specific organization and allocation of program functionality described herein.

The example environment illustrated in FIG. 1A is not intended to limit implementations disclosed herein. Indeed, other alternative hardware and/or software environments may be used without departing from the scope of implementations disclosed herein.

Figure 2:
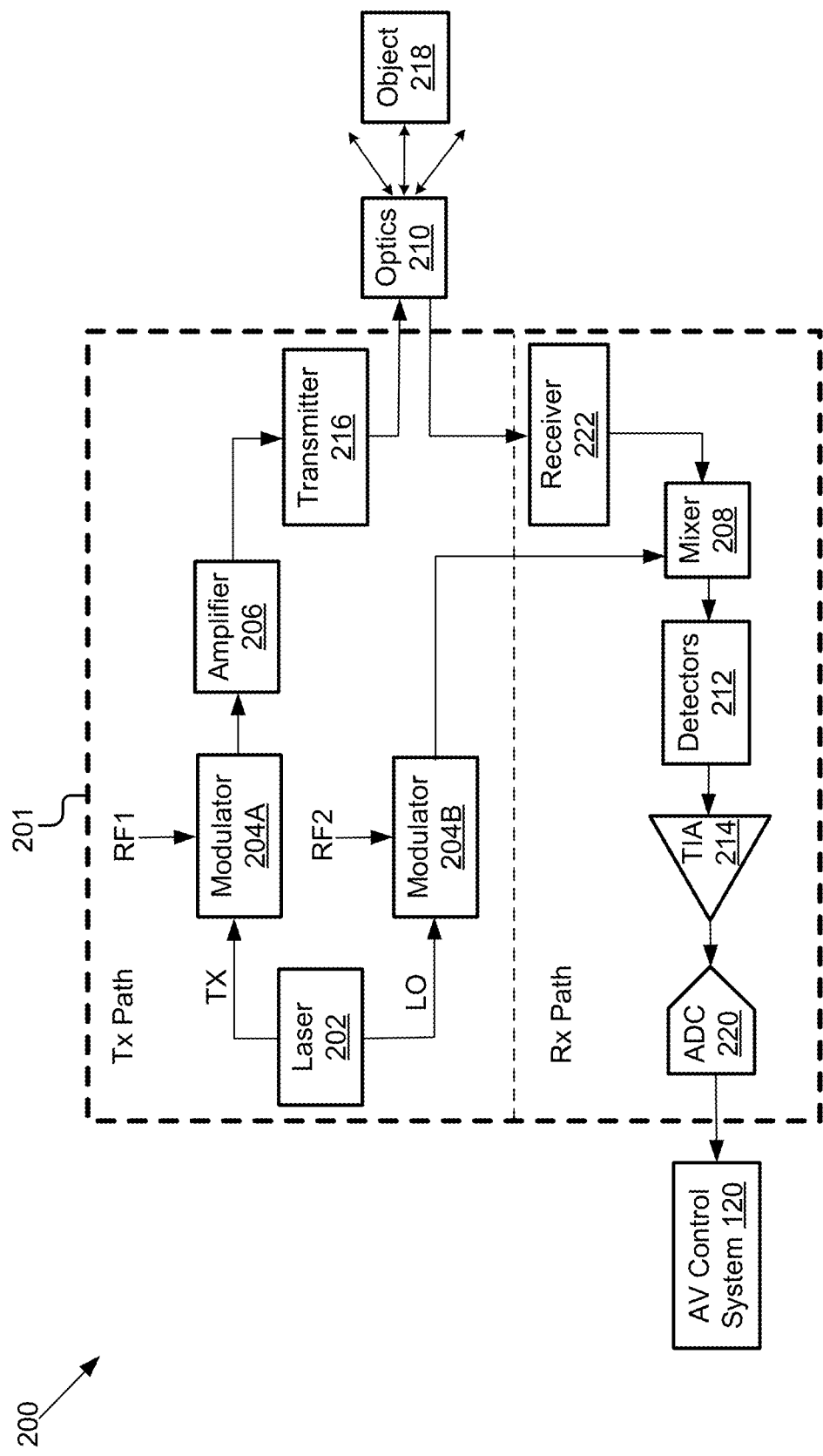
FIG. 2 is a block diagram illustrating an example of a LIDAR sensor system for autonomous vehicles, according to some implementations.

A truck can include a LIDAR system (e.g., vehicle control system 120 in FIG. 1A, LIDAR sensor system 201 in FIG. 2, etc.). In some implementations, the LIDAR system can use frequency modulation to encode an optical signal and scatter the encoded optical signal into free-space using optics. By detecting the frequency differences between the encoded optical signal and a returned signal reflected back from an object, the frequency modulated (FM) LIDAR system can determine the location of the object and/or precisely measure the velocity of the object using the Doppler effect. An FM LIDAR system may use a continuous wave (referred to as, "FMCW LIDAR" or "coherent FMCW LIDAR") or a quasi-continuous wave (referred to as, "FMQW LIDAR"). The LIDAR system can use phase modulation (PM) to encode an optical signal and scatter the encoded optical signal into free-space using optics.

An FM or phase-modulated (PM) LIDAR system may provide substantial advantages over conventional LIDAR systems with respect to automotive and/or commercial trucking applications. To begin, in some instances, an object (e.g., a pedestrian wearing dark clothing) may have a low reflectivity, in that it only reflects back to the sensors (e.g., sensors 130 in FIG. 1A) of the FM or PM LIDAR system a low amount (e.g., 10% or less) of the light that hits the object. In other instances, an object (e.g., a shiny road sign) may have a high reflectivity (e.g., above 10%), in that it reflects back to the sensors of the FM LIDAR system a high amount of the light that hit the object.

Regardless of the object's reflectivity, an FM LIDAR system may be able to detect (e.g., classify, recognize, discover, etc.) the object at greater distances (e.g., 2×) than a conventional LIDAR system. For example, an FM LIDAR system may detect a low reflectivity object beyond 300 meters, and a high reflectivity object beyond 400 meters.

To achieve such improvements in detection capability, the FM LIDAR system may use sensors (e.g., sensors 130 in FIG. 1A). In some implementations, these sensors can be single photon sensitive, meaning that they can detect the smallest amount of light possible. While an FM LIDAR system may, in some applications, use infrared wavelengths (e.g., 950 nm, 1550 nm, etc.), it is not limited to the infrared wavelength range (e.g., near infrared: 800 nm-1500 nm; middle infrared: 1500 nm-5600 nm; and far infrared: 5600 nm-1,000,000 nm). By operating the FM or PM LIDAR system in infrared wavelengths, the FM or PM LIDAR system can broadcast stronger light pulses or light beams while meeting eye safety standards. Conventional LIDAR systems are often not single photon sensitive and/or only operate in near infrared wavelengths, requiring them to limit their light output (and distance detection capability) for eye safety reasons.

Thus, by detecting an object at greater distances, an FM LIDAR system may have more time to react to unexpected obstacles. Indeed, even a few milliseconds of extra time could improve safety and comfort, especially with heavy vehicles (e.g., commercial trucking vehicles) that are driving at highway speeds.

Another advantage of an FM LIDAR system is that it provides accurate velocity for each data point instantaneously. In some implementations, a velocity measurement is accomplished using the Doppler effect which shifts frequency of the light received from the object based at least one of the velocity in the radial direction (e.g., the direction vector between the object detected and the sensor) or the frequency of the laser signal. For example, for velocities encountered in on-road situations where the velocity is less than 100 meters per second (m/s), this shift at a wavelength of 1550 nanometers (nm) amounts to the frequency shift that is less than 130 megahertz (MHz). This frequency shift is small such that it is difficult to detect directly in the optical domain. However, by using coherent detection in PMCW or FMCW LIDAR systems, the signal can be converted to the RF domain such that the frequency shift can be calculated using various signal processing techniques. This enables the autonomous vehicle control system to process incoming data faster.

Instantaneous velocity calculation also makes it easier for the FM LIDAR system to determine distant or sparse data points as objects and/or track how those objects are moving over time. For example, an FM LIDAR sensor (e.g., sensors 130 in FIG. 1A) may only receive a few returns (e.g., hits) on an object that is 300 m away, but if those return give a velocity value of interest (e.g., moving towards the vehicle at >70 mph), then the FM LIDAR system and/or the autonomous vehicle control system may determine respective weights to probabilities associated with the objects.

Faster identification and/or tracking of the FM LIDAR system gives an autonomous vehicle control system more time to maneuver a vehicle. A better understanding of how fast objects are moving also allows the autonomous vehicle control system to plan a better reaction.

Another advantage of an FM LIDAR system is that it is less static compared to conventional LIDAR systems. That is, the conventional LIDAR systems that are designed to be more light-sensitive typically perform poorly in bright sunlight. These systems also tend to suffer from crosstalk (e.g., when sensors get confused by each other's light pulses or light beams) and from self-interference (e.g., when a sensor gets confused by its own previous light pulse or light beam). To overcome these disadvantages, vehicles using the conventional LIDAR systems often need extra hardware, complex software, and/or more computational power to manage this "noise."

In contrast, FM LIDAR systems do not suffer from these types of issues because each sensor is specially designed to respond only to its own light characteristics (e.g., light beams, light waves, light pulses). If the returning light does not match the timing, frequency, and/or wavelength of what was originally transmitted, then the FM sensor can filter (e.g., remove, ignore, etc.) out that data point. As such, FM LIDAR systems produce (e.g., generates, derives, etc.) more accurate data with less hardware or software requirements, enabling safer and smoother driving.

Lastly, an FM LIDAR system is easier to scale than conventional LIDAR systems. As more self-driving vehicles (e.g., cars, commercial trucks, etc.) show up on the road, those powered by an FM LIDAR system likely will not have to contend with interference issues from sensor crosstalk. Furthermore, an FM LIDAR system uses less optical peak power than conventional LIDAR sensors. As such, some or all of the optical components for an FM LIDAR can be produced on a single chip, which produces its own benefits, as discussed herein.

Figure 1B:
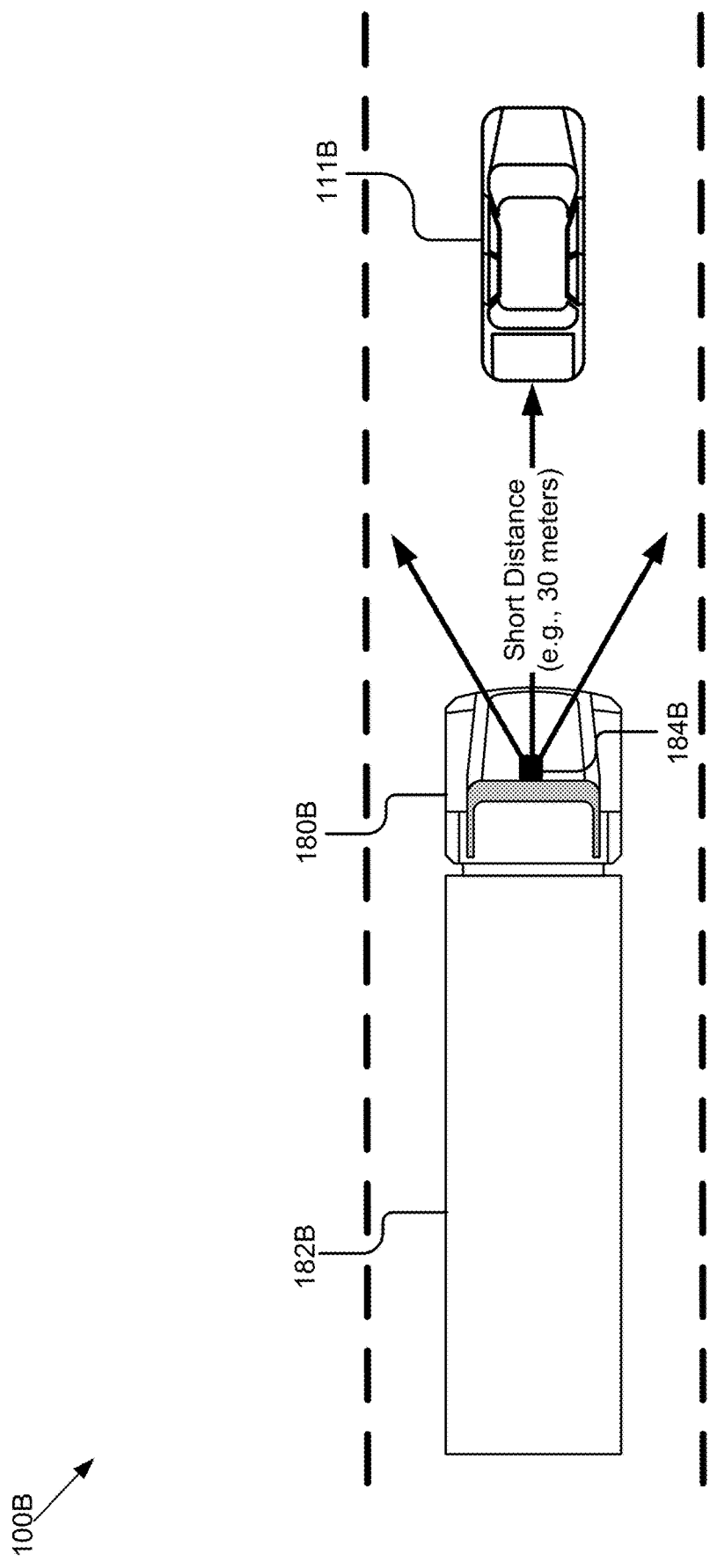
FIG. 1B is a block diagram illustrating an example of a system environment for autonomous commercial trucking vehicles, according to some implementations.

FIG. 1B is a block diagram illustrating an example of a system environment for autonomous commercial trucking vehicles, according to some implementations. The environment 100B includes a commercial truck 180B for hauling cargo 182B. In some implementations, the commercial truck 180B may include vehicles configured to long-haul freight transport, regional freight transport, intermodal freight transport (i.e., in which a road-based vehicle is used as one of multiple modes of transportation to move freight), and/or any other road-based freight transport applications. The commercial truck 180B may be a flatbed truck, a refrigerated truck (e.g., a reefer truck), a vented van (e.g., dry van), a moving truck, etc. The cargo 182B may be goods and/or produce. The commercial truck 180B may include a trailer to carry the cargo 182B, such as a flatbed trailer, a lowboy trailer, a step deck trailer, an extendable flatbed trailer, a side kit trailer, etc.

The environment 100B includes an object 111B (shown in FIG. 1B as another vehicle) that is within a distance range that is equal to or less than 30 meters from the truck.

The commercial truck 180B may include a LIDAR system 184B (e.g., an FM LIDAR system, vehicle control system 120 in FIG. 1A, LIDAR sensor system 201 in FIG. 2, etc.) for determining a distance to the object 111B and/or measuring the velocity of the object 111B. Although FIG. 1B shows that one LIDAR system 184B is mounted on the front of the commercial truck 180B, the number of LIDAR systems and the mounting area of the LIDAR systems on the commercial truck are not limited to a particular number or a particular area. The commercial truck 180B may include any number of LIDAR systems 184B (or components thereof, such as sensors, modulators, coherent signal generators, etc.) that are mounted onto any area (e.g., front, back, side, top, bottom, underneath, and/or bottom) of the commercial truck 180B to facilitate the detection of an object in any free-space relative to the commercial truck 180B.

As shown, the LIDAR system 184B in environment 100B may be configured to detect an object (e.g., another vehicle, a bicycle, a tree, street signs, potholes, etc.) at short distances (e.g., 30 meters or less) from the commercial truck 180B.

Figure 1C:
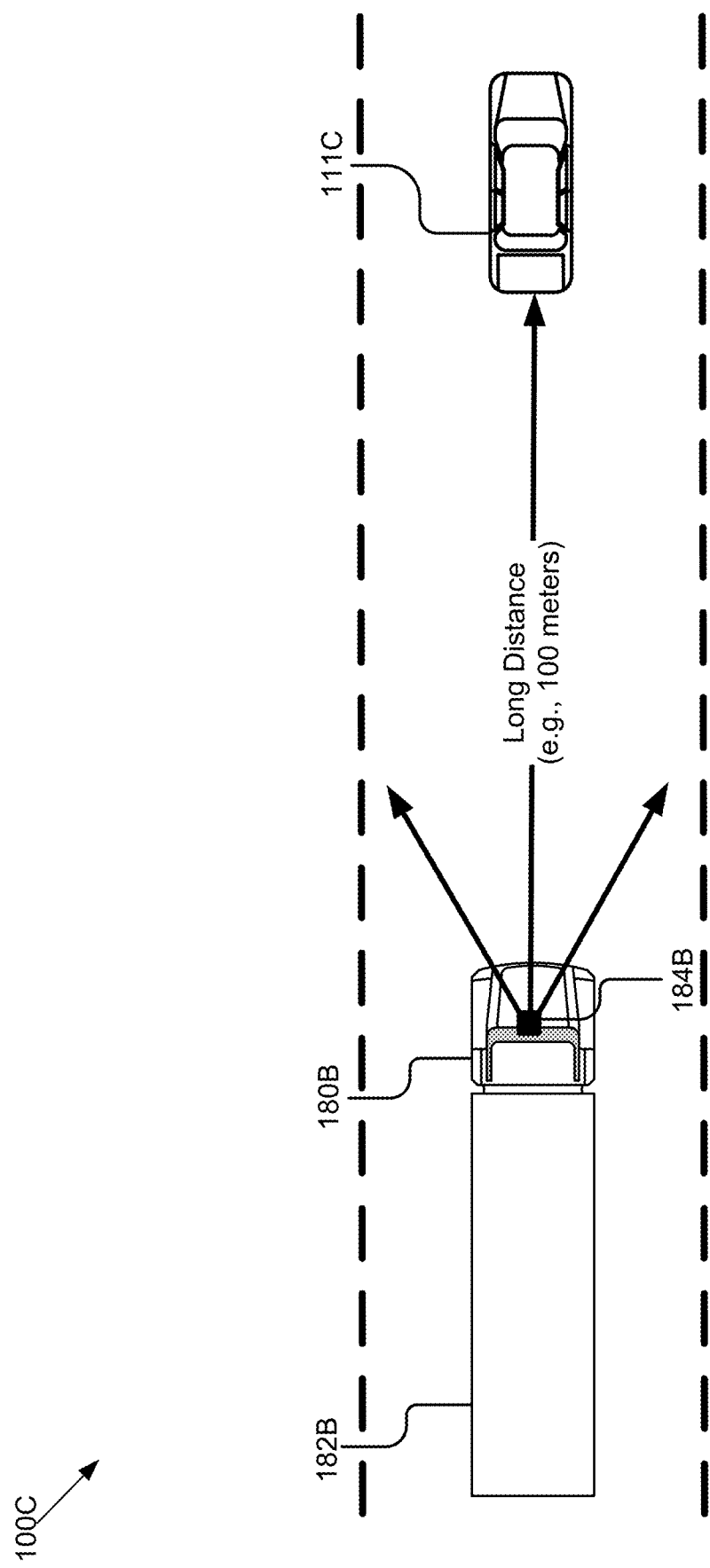
FIG. 1C is a block diagram illustrating an example of a system environment for autonomous commercial trucking vehicles, according to some implementations.

FIG. 1C is a block diagram illustrating an example of a system environment for autonomous commercial trucking vehicles, according to some implementations. The environment 100C includes the same components (e.g., commercial truck 180B, cargo 182B, LIDAR system 184B, etc.) that are included in environment 100B.

The environment 100C includes an object 111C (shown in FIG. 1C as another vehicle) that is within a distance range that is (i) more than 30 meters and (ii) equal to or less than 150 meters from the commercial truck 180B. As shown, the LIDAR system 184B in environment 100C may be configured to detect an object (e.g., another vehicle, a bicycle, a tree, street signs, potholes, etc.) at a distance (e.g., 100 meters) from the commercial truck 180B.

Figure 1D:
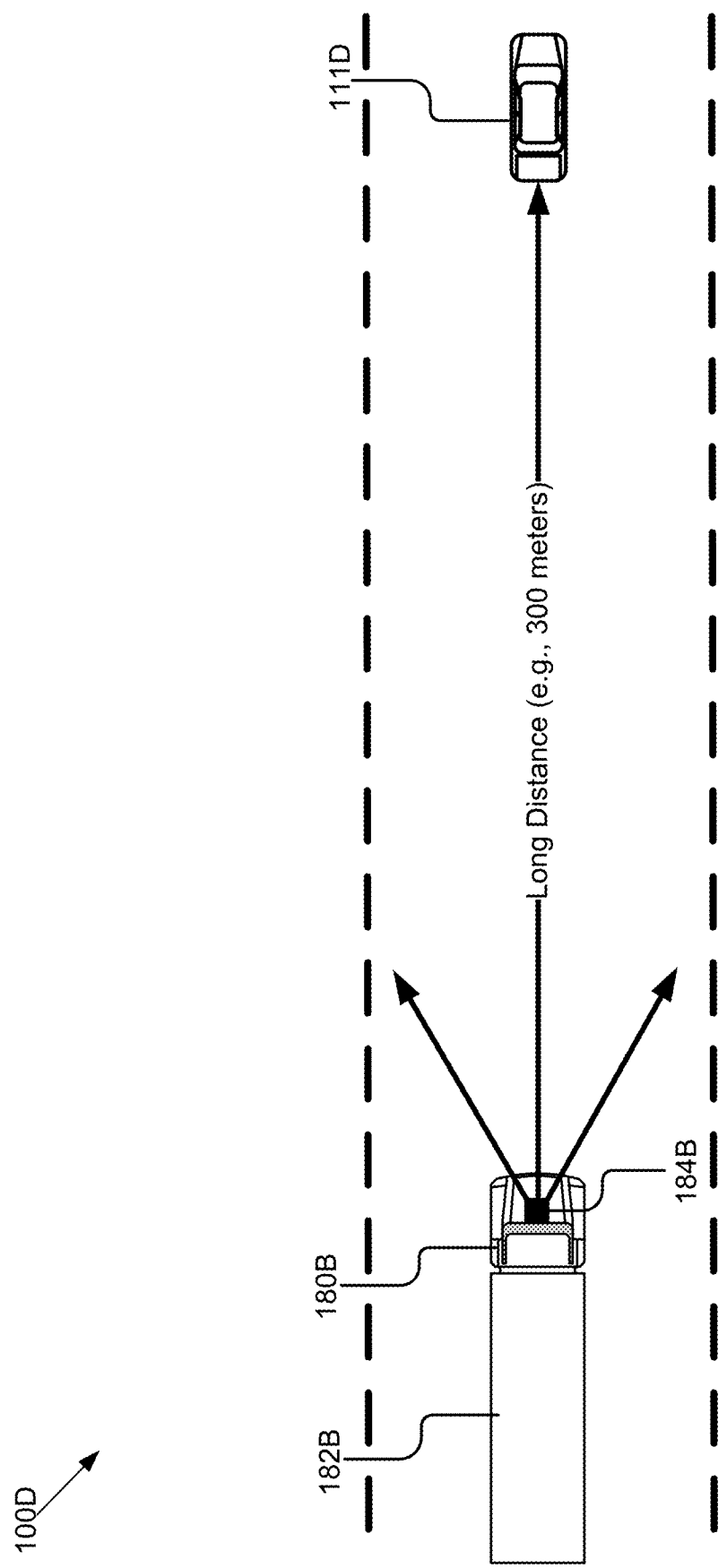
FIG. 1D is a block diagram illustrating an example of a system environment for autonomous commercial trucking vehicles, according to some implementations.

FIG. 1D is a block diagram illustrating an example of a system environment for autonomous commercial trucking vehicles, according to some implementations. The environment 100D includes the same components (e.g., commercial truck 180B, cargo 182B, LIDAR system 184B, etc.) that are included in environment 100B.

The environment 100D includes an object 111D (shown in FIG. 1D as another vehicle) that is within a distance range that is more than 150 meters from the commercial truck 180B. As shown, the LIDAR system 184B in environment 100D may be configured to detect an object (e.g., another vehicle, a bicycle, a tree, street signs, potholes, etc.) at a distance (e.g., 300 meters) from the commercial truck 180B.

In commercial trucking applications, it is important to effectively detect objects at all ranges due to the increased weight and, accordingly, longer stopping distance required for such vehicles. FM LIDAR systems (e.g., FMCW and/or FMQW systems) or PM LIDAR systems are well-suited for commercial trucking applications due to the advantages described above. As a result, commercial trucks equipped with such systems may have an enhanced ability to safely move both people and goods across short or long distances, improving the safety of not only the commercial truck but of the surrounding vehicles as well. In various implementations, such FM or PM LIDAR systems can be used in semi-autonomous applications, in which the commercial truck has a driver and some functions of the commercial truck are autonomously operated using the FM or PM LIDAR system, or fully autonomous applications, in which the commercial truck is operated entirely by the FM or LIDAR system, alone or in combination with other vehicle systems.

In a LIDAR system that uses CW modulation, the modulator modulates the laser light continuously. For example, if a modulation cycle is 10 seconds, an input signal is modulated throughout the whole 10 seconds. Instead, in a LIDAR system that uses quasi-CW modulation, the modulator modulates the laser light to have both an active portion and an inactive portion. For example, for a 10 second cycle, the modulator modulates the laser light only for 8 seconds (sometimes referred to as, "the active portion"), but does not modulate the laser light for 2 seconds (sometimes referred to as, "the inactive portion"). By doing this, the LIDAR system may be able to reduce power consumption for the 2 seconds because the modulator does not have to provide a continuous signal.

In Frequency Modulated Continuous Wave (FMCW) LIDAR for automotive applications, it may be beneficial to operate the LIDAR system using quasi-CW modulation where FMCW measurement and signal processing methodologies are used, but the light signal is not in the on-state (e.g., enabled, powered, transmitting, etc.) all the time. In some implementations, Quasi-CW modulation can have a duty cycle that is equal to or greater than 1% and up to 50%. If the energy in the off-state (e.g., disabled, powered-down, etc.) can be expended during the actual measurement time then there may be a boost to signal-to-noise ratio (SNR) and/or a reduction in signal processing requirements to coherently integrate all the energy in the longer time scale.

FIG. 2 is a block diagram illustrating an example environment of a LIDAR sensor system for autonomous vehicles, according to some implementations. The environment 200 includes a LIDAR sensor system 201 that includes a transmit (Tx) path and a receive (Rx) path. The Tx path includes one or more Tx input/output ports (not shown in FIG. 2) and the Rx path includes one or more Rx input/output ports (not shown in FIG. 2).

In some implementations, a semiconductor substrate and/or semiconductor package may include the Tx path and the Rx. In some implementations, the semiconductor substrate and/or semiconductor package may include at least one of silicon photonics circuitry, programmable logic controller (PLC), or III-V semiconductor circuitry.

In some implementations, a first semiconductor substrate and/or a first semiconductor package may include the Tx path and a second semiconductor substrate and/or a second semiconductor package may include the Rx path. In some arrangements, the Rx input/output ports and/or the Tx input/output ports may occur (or be formed/disposed/located/placed) along one or more edges of one or more semiconductor substrates and/or semiconductor packages.

The environment 200 includes one or more transmitters 216 and one or more receivers 222.

The environment 200 includes one or more optics 210 (e.g., an oscillatory scanner, a unidirectional scanner, a Risley prism, a circulator optic, and/or a beam collimator, etc.) that are coupled to the LIDAR sensor system 201. In some implementations, the one or more optics 210 may be coupled to the Tx path via the one or more Tx input/output ports. In some implementations, the one or more optics 210 may be coupled to the Rx path via the one or more Rx input/output ports.

The environment 200 includes a vehicle control system 120 (e.g., vehicle control system 120 in FIG. 1A) that is coupled to the LIDAR sensor system 201. In some implementations, the vehicle control system 120 may be coupled to the Rx path via the one or more Rx input/output ports.

The Tx path may include a laser source 202, a modulator 204A, a modulator 204B, an amplifier 206, and one or more transmitters 216. The Rx path may include one or more receivers 222, a mixer 208, a detector 212, a transimpedance amplifier (TIA) 214, and one or more analog-to-digital converters (ADCs). Although FIG. 2 shows only a select number of components and only one input/output channel; the environment 200 may include any number of components and/or input/output channels (in any combination) that are interconnected in any arrangement to facilitate combining multiple functions of a LIDAR system, to support the operation of a vehicle.

The laser source 202 may be configured to generate a light signal (or beam) that is derived from (or associated with) a local oscillator (LO) signal. In some implementations, the light signal may have an operating wavelength that is equal to or substantially equal to 1550 nanometers. In some implementations, the light signal may have an operating wavelength that is between 1400 nanometers and 1440 nanometers.

The laser source 202 may be configured to provide the light signal to the modulator 204A, which is configured to modulate a phase and/or a frequency of the light signal based on a first radio frequency (RF) signal (shown in FIG. 2 as, "RF1") and using Continuous Wave (CW) modulation or quasi-CW modulation to generate a modulated light signal. The modulator 204A may be configured to send the modulated light signal to the amplifier 206. The amplifier 206 may be configured to amplify the modulated light signal to generate an amplified light signal to the optics 210 via the one or more transmitters 216. The one or more transmitters 216 may include one or more optical waveguides or antennas.

The optics 210 may be configured to steer the amplified light signal that it receives from the Tx path into an environment within a given field of view toward an object 218, may receive a returned signal reflected back from the object 218, and provide the returned signal to the mixer 208 of the Rx path via the one or more receivers 222. The one or more receivers 222 may include one or more optical waveguides or antennas. In some arrangements, the transmitters 216 and the receivers 222 may constitute one or more transceivers (not shown in FIG. 2). In some arrangements, the one or more transceivers may include a monostatic transceiver or a bistatic transceiver.

The laser source 202 may be configured to provide the LO signal to the modulator 204B, which is configured to modulate a phase and/or a frequency of the LO signal based on a second RF signal (shown in FIG. 2 as, "RF2") and using Continuous Wave (CW) modulation or quasi-CW modulation to generate a modulated LO signal and send the modulated LO signal to the mixer 208 of the Rx path.

The mixer 208 may be configured to mix (e.g., combine, multiply, etc.) the modulated LO signal with the returned signal to generate a down-converted signal and send the down-converted signal to the detector 212. In some arrangements, the mixer 208 may be configured to send the modulated LO signal to the detector 212.

The detector 212 may be configured to generate an electrical signal based on the down-converted signal and send the electrical signal to the TIA 214. In some arrangements, the detector 212 may be configured to generate an electrical signal based on the down-converted signal and the modulated signal.

The TIA 214 may be configured to amplify the electrical signal and send the amplified electrical signal to the vehicle control system 120 via the one or more ADCs 220.

In some implementations, the TIA 214 may have a peak noise-equivalent power (NEP) that is less than 5 picowatts per square root Hertz (i.e., $5 \times 10^{-12}$ Watts per square root Hertz). In some implementations, the TIA 214 may have a gain between 4 kiloohms and 25 kiloohms.

In some implementations, detector 212 and/or TIA 214 may have a 3 decibel bandwidth between 80 kilohertz (kHz) and 450 megahertz (MHz).

The vehicle control system 120 may be configured to determine a distance to the object 218 and/or measure the velocity of the object 218 based on the one or more electrical signals that it receives from the TIA via the one or more ADCs 220.

In some implementations, modulator 204A and/or modulator 204B may have a bandwidth between 400 megahertz (MHz) and 1000 (MHz).

In some implementations, the modulator 204A may be configured to send a first modulated light (optical) signal and a second modulated light (optical) signal to the amplifier 206. The amplifier 206 may be configured to amplify the first and second modulated light signals to generate amplified light signals to the optics 210 via the transmitters 216. The optics 210 may be configured to steer the first and second modulated light signals that it receives from the Tx path into an environment within a given field of view toward an object 218, may receive corresponding first and second returned signals reflected back from the object 218, and provide the first and second returned signals to the mixer 208 of the Rx path via the receivers 222. The modulator 204B may be configured to generate (1) a first modulated LO signal associated with the first modulated light signal and (2) a second modulated LO signal associated with the second modulated light signal, and send the first and second modulated LO signals to the mixer 208 of the Rx path. The mixer 208 may be configured to pair (e.g., associate, link, identify, etc.) the first returned light signal and the first modulated LO signal, and mix (e.g., combine, multiply, etc.) the first returned light signal and the first modulated LO signal to generate a first down-converted signal and send the first down-converted signal to the detector 212. Similarly, the mixer 208 may be configured to pair the second returned light signal and the second modulated LO signal, and mix the second returned light signal and the second modulated LO signal to generate a second down-converted signal and send the second down-converted signal to the detector 212. The detector 212 may be configured to generate first and second electrical signals based on the first and second down-converted signal, respectively. The vehicle control system 120 may be configured to determine a distance to the object 218 and/or measure the velocity of the object 218 based on the first and second electrical signals, received via TIA 214 and ADCs 220.

Figure 3:
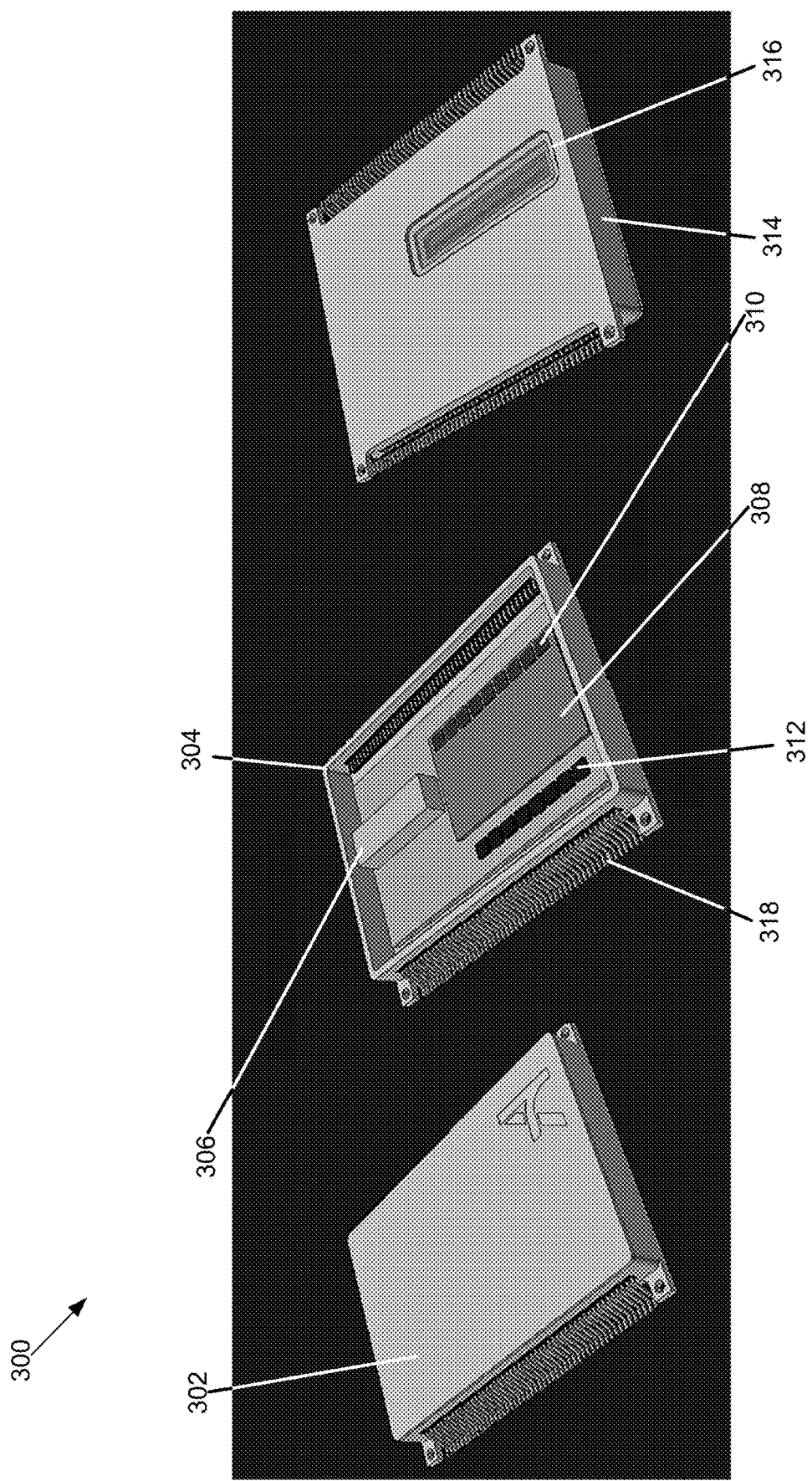
FIG. 3 is a high-level pictorial diagram illustrating an example integrated chip packaging of a coherent LIDAR sensor for autonomous vehicles, according to some implementations.

FIG. 3 is a high-level pictorial diagram 300 illustrating an example integrated chip packaging of a coherent LIDAR sensor for autonomous vehicles, according to some implementations. In some implementations, the integrated chip packaging may be a "gold box" assembly—a metallic housing that hosts and integrates one or more of the optical components and electronic components. There may be no optical components outside the integrated chip packaging. FIG. 3 depicts a top perspective view 302 of the integrated chip packaging enclosing the components. The integrated chip packaging may be hermetically sealed to protect the enclosed components from environmental conditions (e.g., humidity, moisture, contaminants, temperature, pressure, etc.) and extend their operational lifespan. In one example, the dimensions of integrated chip packaging may be 15 millimeters in length and 10 millimeters in width, and may have any suitable thickness.

Furthermore, FIG. 3 depicts an open top view 304 of the integrated chip packaging showing an example configuration of the enclosed components inside the integrated chip packaging. For example, the configuration may include a laser seed assembly 306, a silicon photonics transceiver chip 308, an assembly of semiconductor optical amplifier (SOA) array chips 310, and an assembly of transimpedance amplifiers (TIA) 312. The integrated chip packaging includes electrical leads 318 that are wire bonded to the enclosed components for connection to the outside world. In some implementations, the laser seed assembly 306 may include a seed laser or light source (e.g., a distributed feedback (DFB) diode laser source), a modulator, an optical isolator, an optical amplifier, micro-lens, etc. The light or beam from the laser seed assembly may be coupled into the transceiver chip 308 via micro-optics assembly. The transceiver chip 308 processes the beam using the assembly of SOA array chips 310. For example, the transceiver chip 308 may amplify the beam as part of processing. Each SOA array chip 310 may include four to five channels and is configured to amplify the beam through stimulated emission.

Typically, integrated chip packaging for telecommunication applications may include a fiber array at the edge for coupling the optical signal in or out of the integrated chip packaging. In contrast, FIG. 3 depicts a bottom perspective view 314 of the integrated chip packaging for a coherent LIDAR sensor where an optical window 316 is situated for the light signal (or beam) to travel in and out of the integrated chip packaging in the present disclosure. In some implementations, the beam coupled into the transceiver chip 308 may be amplified prior to its surface emission at a right angle from the integrated chip packaging. For example, the beam may be amplified at least twice in the transceiver chip 308 depending on the architecture of the transceiver chip 308 and the assembly of SOA array chips 310. The beam is emitted perpendicularly from the surface of the transceiver chip 308 into the outside world through the optical window 316. The optical window 316 facilitates surface coupling of light from the transceiver chip 308 to another device outside the integrated chip packaging for the coherent LIDAR sensor. The beam reflected back from a target is received through the same optical window 316 and processed by the transceiver chip 308. For example, the reflected beam is processed to generate a photocurrent. The transceiver chip 308 sends the photocurrent to the assembly of TIA 312. The TIA 312 converts the photocurrent into a voltage signal. The voltage signal is wire bonded out of the integrated chip packaging through the electrical leads 318.

Figure 4:
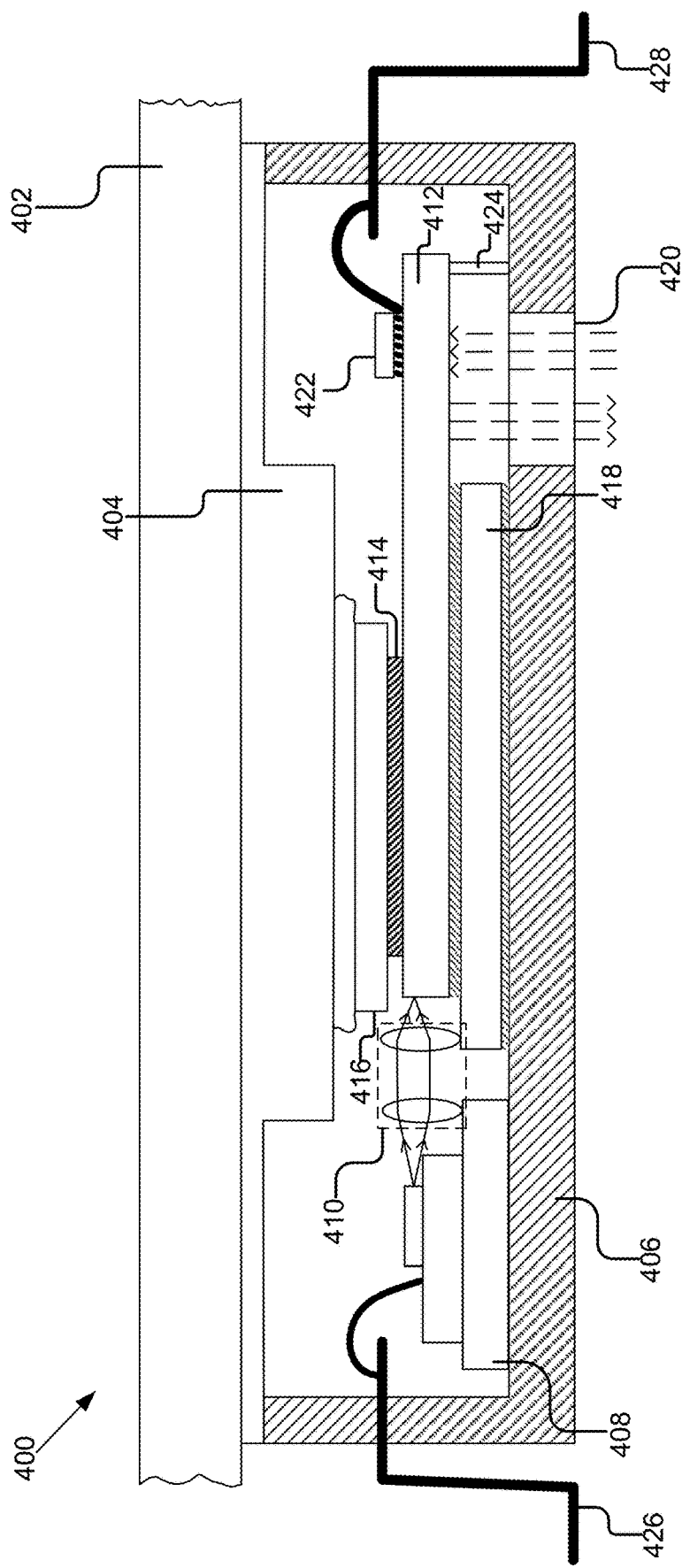
FIG. 4 is a cross-sectional diagram illustrating an example integrated chip packaging of a coherent LIDAR sensor for autonomous vehicles, according to some implementations.

FIG. 4 is a cross-sectional diagram illustrating an example integrated chip packaging 400 of a coherent LIDAR sensor for autonomous vehicles, according to some implementations. In FIG. 4, the integrated chip packaging 400 for the coherent LIDAR sensor defines a configuration of optical components that provide a path for the light signal or beam to travel in and out of the integrated chip packaging 400 and dissipate the heat generated by the optical components for improved performance. The integrated chip packaging 400 may include a lid 404 covering a top side of the integrated chip packaging 400. The integrated chip packaging 400 may include a base plate 406 coupled to the lid 404, thereby enclosing the optical components in a hermetic seal. For example, the base plate 406 may be made of copper, ceramics, nickel-iron (Ni—Fe) alloy, copper-tungsten (CuW) alloy, or combinations thereof. In some implementations, the base plate may be made of CuW alloy as it provides a combination of thermal conductivity and coefficient of thermal expansion (CTE) that is close to that of ceramics and semiconductor materials. The integrated chip packaging 400 may include a cold plate 402 coupled to a side of the integrated chip packaging 400. In some implementations, the cold plate 402 may be a heat sink, a heat pipe, or a vapor chamber that provides an active cooling effect to the lid 404 and the base plate 406 of the integrated chip packaging 400. In some implementations, the cold plate 402 may be coupled to the lid 404 to be on top of the lid 404. In other implementations, the cold plate 402 may be coupled to the base plate 406 to be below the base plate 406 opposite the lid 404 in such a way as to not obstruct the optical window 420. The material of the cold plate 402 may be from one of copper, aluminum, and silicon.

In some implementations, the cold plate 402 may have a reference temperature associated with it that dictates the operation of the optical components within the integrated chip packaging 400. For example, the operating temperature of one or more optical components enclosed within the integrated chip packaging 400 may not exceed the reference temperature of the cold plate 402. The integrated chip packaging 400 may include a fiber-free micro-optical bench (MOB) 408. The MOB 408 may be an optical coupling assembly that includes a configuration of a seed laser or light source (e.g., a distributed feedback (DFB) diode laser source), a modulator, an optical isolator, an optical amplifier, micro-lens, etc. The integrated chip packaging 400 couples the enclosed components to the outside world by providing interfaces for electrical and optical signals. In one example, the MOB 408 is connected to an external electrical connection through the electrical feedthrough 426 of the integrated chip packaging 400. The MOB 408 may be configured to output a beam based on the input voltage signal received through the electrical feedthrough 426.

The integrated chip packaging 400 may include a silicon photonics transceiver chip 412 that is separate from the MOB 408. The transceiver chip 412 is coupled to the MOB 408 via the micro-optics assembly 410 and configured to receive the beam output by the MOB 408. For example, the micro-optics assembly 410 may include a micro-lens array for collimating the beam from the MOB 408 into a coupling facet on the edge of the transceiver chip 412. The integrated chip packaging 400 may include an assembly of semiconductor optical amplifier (SOA) array chips 414. A SOA array chip 414 may be implemented as III-V semiconductor module coupled to the transceiver chip 412 by hybrid integration on a top surface of the transceiver chip 412. This hybrid integration is beneficial as it removes the need for micro-optics assembly to couple the SOA array chip 414 with the transceiver chip 412. The transceiver chip 412 is configured to process the beam received from the MOB 408. For example, the transceiver chip 412 amplifies the beam using one or more SOA array chips 414.

The integrated chip packaging 400 may include an optical window 420 in the base plate 406 on the bottom side opposite to the lid 404 to provide an interface for optical signals. The material of the optical window 420 may be one of glass, fused silica, and organic polymer. The optical window 420 allows the beam to travel in and out of the surface-emitting transceiver chip 412. After amplifying the beam using the assembly of SOA array chips 414 on the top surface, the transceiver chip 412 is configured to emit the beam perpendicularly from the bottom surface through the optical window 420. For example, the beam is emitted out of the integrated chip packaging 400 at a right angle to the bottom surface of the transceiver chip 412. An advantage of the surface emission of beam from the transceiver chip 412 is that the optical window 420 can be configured in any suitable location compared to edge emission from the transceiver chip 412. If the beam were to be emitted from the edge of the transceiver chip 412, the optical window 420 may need careful alignment where the optical window 420 is made to be flush with the narrow edge of the transceiver chip 412. As such, the surface emission feature of the transceiver chip 412 lends to easy assembly and manufacturability of the integrated chip packaging 400. The transceiver chip 412 may be configured to extend laterally over the optical window 420 by a threshold offset to sufficiently overlap the optical window 420 within the integrated chip packaging 400. For example, the threshold offset may be in the range between 0.2 millimeters and 9 millimeters. The end of the transceiver chip 412 extending laterally over the optical window 420 may be coupled to a supporting structure 424 for mechanical strength. In one example, the dimensions of the optical window may be 10 millimeters in length and 5 millimeters in width. The distance between the bottom surface of the transceiver chip 412 and the optical window 420 may be about one millimeter but may be in a range between 0.2 millimeters and nine millimeters. In some implementations, the space between the bottom surface of the transceiver chip 412 and the optical window 420 may be filled with a transparent material, such as an optically clear epoxy.

The beam emitted from the integrated chip packaging 400 may hit a target and get reflected back into the integrated chip packaging 400 through the same optical window 420. The transceiver chip 412 is configured to receive and process the reflected beam from the target. For example, the transceiver chip 412 may configure a photodiode to generate a photocurrent based on the reflected beam collected through the optical window 420 and send the resulting photocurrent to a transimpedance amplifier (TIA) 422. In some implementations, the integrated chip packaging 400 may include the TIA 422 integrated with the transceiver chip 412 using flip-chip bonding. The TIA 422 may be configured to convert the photocurrent into a voltage signal which is then coupled out of the integrated chip packaging 400 through the electrical feedthrough 428 of the integrated chip packaging 400. In some implementations, the integrated chip packaging 400 may include the TIA 422 on a surface of a chip carrier off the transceiver chip 412 and couple it to the transceiver chip 412. In other implementations, the integrated chip packaging 400 excludes the TIA 422 from the packaged integration. For example, the TIA 422 may be located outside of the integrated chip packaging 400.

In some implementations, the integrated chip packaging 400 may include a configuration of double-sided heat transfer assembly for dissipating heat generated by the enclosed components during operation and maintaining the temperature of the enclosed components at or below the reference temperature of the cold plate 402. For example, the reference temperature of the cold plate 402 may be 50 degrees Celsius. In other implementations, the cold plate 402 provides a cooling capability in addition to the double-sided heat transfer assembly to maintain a temperature of the enclosed components within the integrated chip packaging 400 at or below a certain temperature limit for effective operation of the enclosed components. In a double-sided heat transfer assembly, a first heat transfer component 418 may be coupled to the bottom surface of the transceiver chip 412 such that it is placed between the transceiver chip 412 and the metal base plate 406 for heat dissipation. A second heat transfer component 416 may be coupled to the exposed, top surface of SOA array chip 414 such that it is placed between the SOA array chip 414 and the lid 404 of the integrated chip packaging 400 for heat dissipation. For example, the heat transfer component may be a thermal interface material (e.g., aluminum nitride (AlN) ceramic, beryllium oxide ceramic, pyrolytic graphite sheet (PGS), etc.), a thermoelectric cooler (TEC), a liquid cooling system, or combinations thereof. In the example of FIG. 4, the first heat transfer component 418 may be a thermoelectric cooler or aluminum nitride ceramic. The second heat transfer component 416 may include a first layer of thermal interface material, such as an AlN-n-clamp coupled to the exposed surface of SOA array chip 414 and a second layer of thermal interface material, such as PGS coupled to the top of the first layer. The height of the first heat transfer component 418 may be thin. This thin height of the first heat transfer component reduces the divergence of light emitting from the bottom surface of the transceiver chip 412 through the optical window 420. The combination of a small optical window 420 and a thin height of the first heat transfer component 418 results in a large area under the transceiver chip 412 to be covered by the first heat transfer component 418 for effective heat dissipation.

In some implementations, the integrated chip packaging 400 may include a configuration of a single-sided heat transfer assembly where only a single heat transfer component 418 is coupled to the bottom surface of the transceiver chip 412. In some implementations, the integrated chip packaging 400 may include a heat transfer assembly coupled to the seed laser in the MOB 408 to control its temperature. High temperature may affect, for example, the III-V compound semiconductors, such as Gallium Arsenide (GaAs), Indium Phosphide (InP), etc. used in the assembly of the seed laser and cause the laser to emit light at a wavelength susceptible to atmospheric attenuation. In one example, a thermoelectric cooler may be coupled to the seed laser in the MOB 408 for temperature control such that the wavelength of light emitted stays within a threshold range (±10 nanometers) of the target wavelength. For example, the threshold range of wavelength corresponds to a region within which the beam experiences low atmospheric loss while traveling in and out of the optical window 420. In some implementations, the integrated chip packaging 400 may include a liquid cooling system wrapped around outside of the integrated chip packaging 400 for heat dissipation in such a way as to not obstruct the optical window 420.

Figure 5:
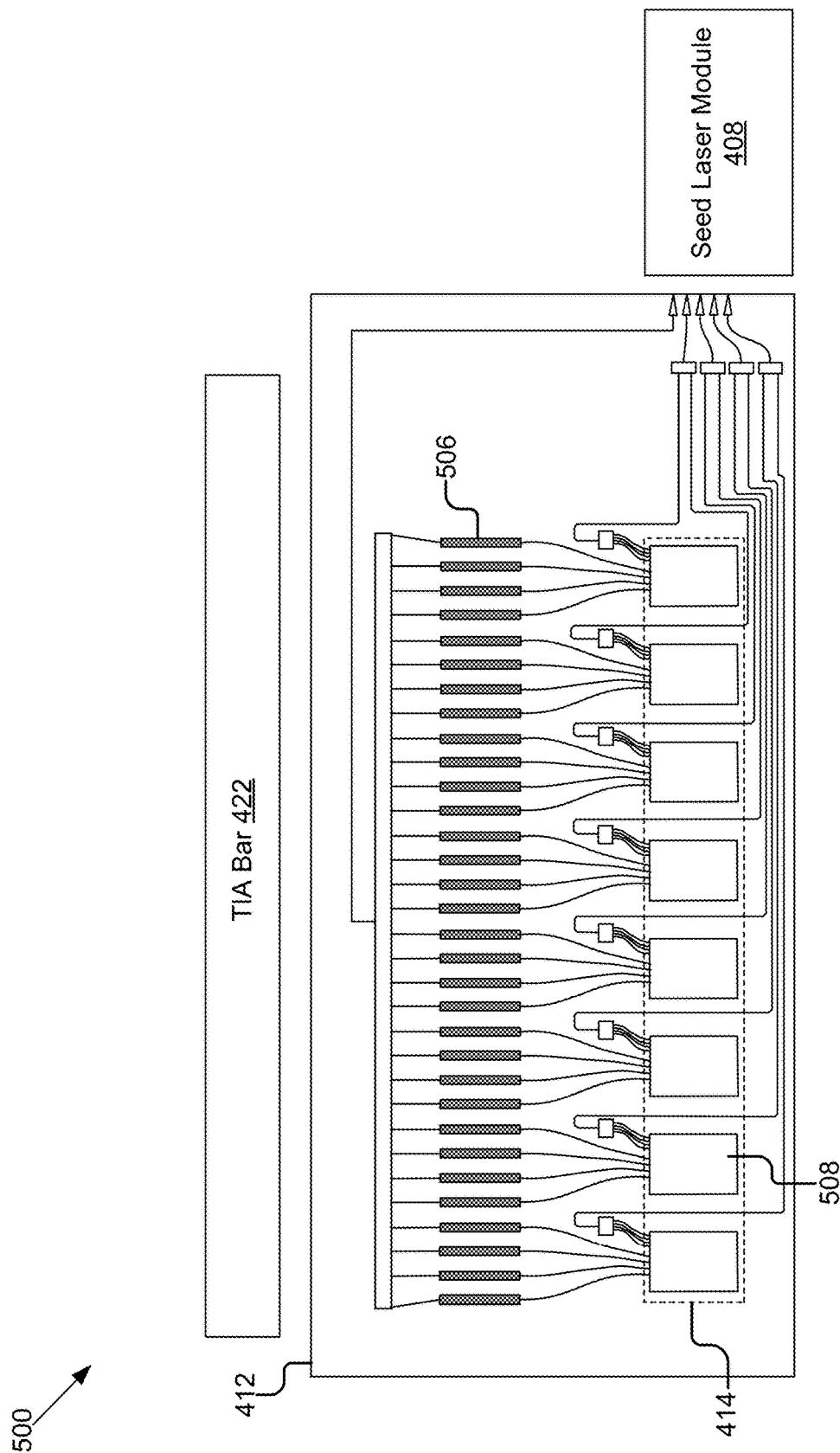
FIG. 5 is a schematic diagram of an example architecture for a coherent LIDAR sensor for autonomous vehicles, according to some implementations.

FIG. 5 is a schematic diagram of an example architecture for a coherent LIDAR sensor 500 in the integrated chip packaging of FIG. 4, according to some implementations. The coherent LIDAR sensor 500 includes a configuration of the seed laser module 408, a transceiver chip 412, an assembly of optical semiconductor amplifier (SOA) array chips 414, and an assembly of transimpedance amplifiers (TIA) in the form of a TIA bar 422. The seed laser module 408 is an abstraction of the MOB 408 in FIG. 4. In some implementations, the seed laser module 408 includes a configuration of a seed laser (e.g., distributed feedback diode (DFB) laser), an isolator, a modulator, and a micro-lens assembly. In some implementations, the seed laser module 408 may include all of its components (e.g., optical paths, optical amplifiers, phase modulators, etc.) formed or disposed on a single substrate. In some implementations, the seed laser module 408 may be a III-V semiconductor-based integrated photonic device in which all of its components are made of III-V materials and formed/disposed on a single substrate made of III-V materials. The III-V materials may include at least one of indium phosphide (InP), indium monoarsenide (InAs), gallium and arsenide (GaAs), gallium and nitride (GaN), and indium antimonide (InSb). The light output by the seed laser module 408 is coupled into the transceiver chip 412 via the micro-lens assembly.

In some implementations, the transceiver chip 412 may include at least one of silicon photonics circuitry, programmable logic controller (PLC), or III-V semiconductor circuitry. The transceiver chip 412 processes the coupled light using one or more semiconductor optical amplifier (SOA) array chips 508. In some implementations, each SOA array chip 508 may include a U-turn waveguide and other passive components for optical amplification. In some implementations, the SOA array chip 508 may be a III-V semiconductor-based integrated photonic device in which all of its components are made of III-V materials and formed/disposed on a single substrate made of III-V materials. The transceiver chip 412 includes a plurality of coherent transmitter (TX)/receiver (RX) devices 506 (transceiver 506) that process the output of the assembly 414 of SOA array chips 508 and emit the light out from the surface of the transceiver chip 412 via an optical window of the integrated chip packaging. In some implementations, the TIA bar 422 may be on a chip carrier and off the transceiver chip 412. The transceiver chip 412 processes the light collected off a reflection from a target and couples the detected photocurrent to the TIA bar 422. The TIA bar 422 converts the photocurrent into an electrical voltage which is then coupled out of the integrated chip packaging.

The schematic as described above is part of the design for an integrated circuit chip. The chip design is created in a graphical computer programming language and stored in a computer readable storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the computer readable storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The foregoing detailed description of the present disclosure has been presented for purposes of illustration and description. It is not intended to be exhaustive or to limit the present disclosure to the precise form disclosed. Many modifications and variations are possible in light of the above teachings. The described implementations were chosen in order to best explain the principles of the present disclosure and its practical application, to thereby enable others skilled in the art to best utilize the present disclosure in various implementations and with various modifications as are suited to the particular use contemplated. It is intended that the scope of the present disclosure be defined by the claims appended hereto.

Although some implementations of the present disclosure and their advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present disclosure is not intended to be limited to the particular implementations of the process, machine, fabrication, composition of matter, means, methods, and steps described in the specification. As one of ordinary skill in the art will readily appreciate from the description of the present disclosure, processes, machines, fabrication, compositions of matter, means, methods, or steps, presently existing or later to be developed, that perform substantially the same function or achieve substantially the same result as the corresponding implementations described herein may be utilized according to the present disclosure. Accordingly, the appended claims are intended to include within their scope such processes, machines, fabrication, compositions of matter, means, methods, or steps.

What is claimed is:

1. An integrated chip packaging of a LIDAR sensor system of a vehicle, the integrated chip packaging comprising:
   a first device including a laser source configured to generate a beam; and
   a second device including a transceiver coupled to the first device, wherein an edge of the second device is coupled to the first device for receiving the beam and the second device is configured to:
      emit the beam at a right angle from a first surface of the second device through an optical window of the integrated chip packaging; and
      receive a reflected beam from a target through the optical window.

2. The integrated chip packaging of claim 1, further comprising a third device including an optical amplifier array coupled to the second device and configured to amplify the beam in association with the second device, the third device coupled to a second surface of the second device.

3. The integrated chip packaging of claim 2, further comprising:
   a cold plate coupled to a first side of the integrated chip packaging, the cold plate having a reference temperature.

4. The integrated chip packaging of claim 3, further comprising:
   a first heat transfer component coupled to the first surface of the second device, the first heat transfer component configured to maintain a temperature of the second device at or below the reference temperature.

5. The integrated chip packaging of claim 4, wherein the first heat transfer component is one from a group of thermal interface material, thermoelectric cooler, and liquid cooling system.

6. The integrated chip packaging of claim 3, further comprising:
   a second heat transfer component coupled to an exposed surface of the third device, the second heat transfer component configured to maintain a temperature of the third device at or below the reference temperature.

7. The integrated chip packaging of claim 3, wherein the optical window is at a second side of the integrated chip packaging opposite to the first side.

8. The integrated chip packaging claim 2, wherein the second device is coupled to the third device by hybrid integration on the second surface of the second device opposite to the first surface and the second device is further configured to process the beam received from the first device.

9. The integrated chip packaging of claim 8, wherein the beam is processed for amplification using the third device prior to being emitted from the first surface of the second device.

10. The integrated chip packaging of claim 1, further comprising:
a third heat transfer component coupled to the first device, the third heat transfer component configured to maintain a temperature of the first device such that a wavelength of the beam emitted is within a threshold range.

11. The integrated chip packaging of claim 1, further comprising:
a fourth device including a transimpedance amplifier configured to convert a photocurrent into a voltage; and
the second device coupled to the fourth device, the second device configured to:
process the reflected beam to generate the photocurrent; and
send the photocurrent to the fourth device.

12. The integrated chip packaging of claim 11, further comprising a second electrical feedthrough coupling the voltage out of the integrated chip packaging.

13. The integrated chip packaging of claim 1 further comprising a first electrical feedthrough coupling an input to the first device.

14. The integrated chip packaging of claim 1, wherein the second device is coupled to the first device through an optics assembly.

15. The integrated chip packaging of claim 1, wherein the second device is further configured to laterally extend over and across the optical window by a threshold offset.

16. The integrated chip packaging of claim 15, wherein the threshold offset is in a range between 0.2 millimeters and 9 millimeters.

17. The integrated chip packaging of claim 1, wherein a distance of the optical window from the first surface of the second device is in a range between 0.2 millimeters and 9 millimeters.

18. The integrated chip packaging of claim 1, wherein a length and a width of the optical window is in a range between 4 millimeters and 30 millimeters.

19. An autonomous vehicle control system comprising:
an integrated chip packaging of a LIDAR sensor system of a vehicle, the integrated chip packaging comprising:
a first device including a laser source configured to generate a beam;
a second device including a transceiver coupled to the first device, wherein an edge of the second device is coupled to the first device for receiving the beam and the second device is configured to:
emit the beam at a right angle from a first surface of the second device through an optical window of the integrated chip packaging; and
receive a reflected beam from a target through the optical window; and
one or more processors configured to:
determine at least one of a range to the target or a velocity of the target using the reflected beam; and
control operation of an autonomous vehicle responsive to the at least one of the range or the velocity.

20. An autonomous vehicle, comprising:
an integrated chip packaging of a LIDAR sensor system of the autonomous vehicle, the integrated chip packaging comprising:
a first device including a laser source configured to generate a beam; and
a second device including a transceiver coupled to the first device, wherein an edge of the second device is coupled to first device for receiving the beam and the second device is configured to:
emit the beam at a right angle from a first surface of the second device through an optical window of the integrated chip packaging; and
receive a reflected beam from a target through the optical window;
a steering system;
a braking system; and
a vehicle controller comprising one or more processors configured to:
determine at least one of a range to the target or a velocity of the target using the reflected beam; and
control operation of the at least one of the steering system and the braking system responsive to the at least one of the range or the velocity.

* * * * *